US012514087B2

(12) United States Patent
Morales Anton

(10) Patent No.: US 12,514,087 B2
(45) Date of Patent: Dec. 30, 2025

(54) PROCESS FOR PRODUCING FLEXIBLE OLED SCREENS

(71) Applicant: Airbus Operations GmbH, Hamburg (DE)

(72) Inventor: Alejandro Morales Anton, Shenzhen (CN)

(73) Assignee: Airbus Operations GmbH, Hamburg (DE)

( * ) Notice: Subject to any disclaimer, the term of this patent is extended or adjusted under 35 U.S.C. 154(b) by 927 days.

(21) Appl. No.: 17/595,598

(22) PCT Filed: Jul. 2, 2020

(86) PCT No.: PCT/EP2020/068739

§ 371 (c)(1),
(2) Date: Nov. 19, 2021

(87) PCT Pub. No.: WO2021/004906

PCT Pub. Date: Jan. 14, 2021

(65) Prior Publication Data

US 2022/0231264 A1 Jul. 21, 2022

Related U.S. Application Data

(60) Provisional application No. 62/908,133, filed on Sep. 30, 2019, provisional application No. 62/870,839, filed on Jul. 5, 2019.

(51) Int. Cl.
*H10K 59/18* (2023.01)
*H10K 59/80* (2023.01)
(Continued)

(52) U.S. Cl.
CPC ........... *H10K 59/18* (2023.02); *H10K 59/873* (2023.02); *H10K 71/00* (2023.02);
(Continued)

(58) Field of Classification Search
CPC .. H10K 71/00; H10K 59/18; H10K 2102/311; H10K 59/873; H10K 59/131; H10K 71/851; B64D 11/0015; G09F 9/301
See application file for complete search history.

(56) References Cited

U.S. PATENT DOCUMENTS

2003/0071566 A1* 4/2003 Kwasnick .............. H10K 59/18 313/506
2005/0012448 A1* 1/2005 Ke ....................... H10K 50/844 313/504
(Continued)

FOREIGN PATENT DOCUMENTS

CN 107623023 A 1/2018
WO 2019229076 A1 12/2019

OTHER PUBLICATIONS

International Search Report from corresponding PCT application No. PCT/EP2020/068739 mailed Nov. 20, 2020.

*Primary Examiner* — Marlon T Fletcher
*Assistant Examiner* — Samuel Jonathan Smith
(74) *Attorney, Agent, or Firm* — Greer, Burns & Crain, Ltd.

(57) ABSTRACT

Processes for producing an OLED screen with a reduced size, in particular for an aircraft. The processes utilize laser cutting to reduce the size of OLED screens from a production line. After the cutting, a plasma coating process seals the cut edges. The portion of the production OLED screen that is cut may be a portion of the display screen. The screens with the reduced sized may be installed in an aircraft, and, two or more of the OLED screens with reduced sized may be positioned adjacent to each other so as to form an array.

11 Claims, 5 Drawing Sheets

(51) Int. Cl.

| | |
|---|---|
| ***H10K 71/00*** | (2023.01) |
| *B64D 11/00* | (2006.01) |
| *H10K 59/131* | (2023.01) |
| *H10K 102/00* | (2023.01) |

(52) U.S. Cl.

CPC ........ *B64D 11/0015* (2013.01); *H10K 59/131* (2023.02); *H10K 2102/311* (2023.02)

(56) References Cited

U.S. PATENT DOCUMENTS

| | | | | |
|---|---|---|---|---|
| 2010/0014009 | A1* | 1/2010 | Stavaeus ............ | B64D 11/0015 348/837 |
| 2013/0241076 | A1* | 9/2013 | Mandlik ................ | H10K 71/00 257/E23.116 |
| 2014/0255288 | A1* | 9/2014 | Arita ..................... | C23C 16/503 427/578 |
| 2015/0042494 | A1* | 2/2015 | Garrettson ............. | G09F 21/08 340/945 |
| 2015/0282293 | A1* | 10/2015 | Lim ..................... | H05K 5/0017 361/783 |
| 2016/0049608 | A1* | 2/2016 | Hack .................... | H10K 50/805 438/46 |
| 2018/0026218 | A1* | 1/2018 | Kobayashi ........... | G09G 3/2003 349/143 |
| 2019/0114961 | A1 | 4/2019 | Chang et al. | |

* cited by examiner

PROCESS FOR PRODUCING FLEXIBLE OLED SCREENS

RELATED APPLICATIONS

This application is a National Stage of International Application No. PCT/EP2020/068739 filed on Jul. 2, 2020, which claims priority to U.S. Provisional Patent Application Ser. No. 62/870,839 filed on Jul. 5, 2019 and to U.S. Provisional Patent Application Ser. No. 62/908,133 filed on Sep. 30, 2019.

FIELD OF THE INVENTION

This invention relates generally to processes for producing flexible organic light emitting diode ("OLED") screens, and more to processes for producing such screens for an aircraft from standards sized OLED screens.

BACKGROUND OF THE INVENTION

Today's flexible OLED market is primarily focused on smartphones, notebooks, monitors, and home displays. Applicant has previously identified the desirability and applicability of incorporating these screens into aircraft. See, International Application No. PCT/EP2019/063848 filed on May 28, 2019 the entirety of which is incorporated herein by reference. Specifically, it has been found that it would be beneficial to incorporate the flexible OLED screens in, for example, a lining panel, a ceiling panel, a floor panel, a hat rack, a cabin door, a compartment separation module, a window blind, a luggage compartment door, a galley sidewall, and a lavatory monument sidewall, to name a few.

However, as noted above, the current OLED market is focused primarily towards high volume consumer goods like smartphones, notebooks, monitors, home displays, and the like. Accordingly, due to the high costs associated with setting up manufacturing lines for OLED screens, the flexible OLED screens currently being produced are sized for these consumer products and mostly have a rectangular shape. While these sizes and shapes are acceptable for the various listed consumer goods, it is believed that the sizes and shapes of these screens are not optimally suitable for use in aircraft environments.

For example, while it is known to arrange two or more screens into an array to provide a display surface with an increased surface size compared to just one screen, the current OLED screens have bezels that are too large for use in an aircraft environment when arranged in a multiple panel array. More specifically, the currently produced OLED screens have bezels that are in the range of four to seven mm. Thus, the crosses or bands formed by adjacent bezels are too wide when the screens are placed adjacent to one another.

The main function of the bezels is to cover the electronic circuits controlling the pixels of the OLED screen. The bezels also function to protect the OLED display from the penetration of moisture and oxygen (that will damage the organic content in the materials forming the OLED screen).

Moreover, even though these OLED screens are being produced for the consumer products, due to the nature of the production processes, it is not a simple task to use existing production lines to produce differently sized screens. Thus, while there is some demand for the OLED screens with the appropriate size and shape for an aircraft environment, the demand does not out weight the high cost of establishing or setting up a new production line for appropriately sized and shaped OLED screens for aircraft. According to current estimates, the cost of setting up one production line for an OLED screen with one specific size is believed to be about $20 million. Thus, due to the different sizes and shapes needed and the relatively low production output expected, it is not currently economically feasible to merely set up new production lines to make the OLED screens for an aircraft environment.

Accordingly, it would be desirable to have effective and efficient processes for the production of OLED screens that are sized and shaped for use in an aircraft environment.

SUMMARY OF THE INVENTION

The present invention is directed at solving one or more of these problems by providing a process for reducing the size of production, or standard sized, OLED screens. More specifically, in one or more aspects, the present invention provides processes that reduce the size of the OLED screens, providing the OLED screen with a configuration that is more suitable to be utilized in an array configuration. According to the various processes, to ensure the resizing of the size and shape of the production OLED screens occurs without moisture and oxygen penetrating into the display, a combination of laser cutting/welding and atmospheric plasma polymer coating processes are used. Thus, the present processes provide for the cost-effective production of OLED screens with customized/specified size and shape from production OLED screens.

Therefore, in one aspect the present invention may be characterized broadly as providing a process for producing flexible OLED screens by: obtaining an OLED screen from a production line; cutting the OLED screen with a laser to reduce the size of the OLED screen and provide a cut OLED screen comprising a cut edge; and, coating the cut edge by a plasma coating process to provide the cut OLED screen with a reduced size compared to the OLED screen from the production line.

The plasma coating process may occur at atmospheric pressure.

The plasma coating process may include applying an organic polymer at the cut edge. The plasma coating process may include applying a silicon oxide coating at the cut edge.

Cutting the OLED screen may include reducing a size of a display area of the OLED screen. The process may also include redefining the display area of the OLED screen based on the reduced size of the display area. The display area of the OLED screen after the size has been cut may be a rectangular shape. The display area of the OLED screen after the size has been cut may include a shape with a perimeter having a non-linear edge.

The process may include arranging two OLED screens with a reduced size in an array.

In another aspect of the present invention, the present invention may be generally characterized as an OLED screen produced according to the processes disclosed herein.

In a further aspect of the present invention, the present invention may be generally characterized as an OLED screen produced according to the processes disclosed herein.

In still another aspect of the present invention, the present invention may be characterized as providing a display surface having at least two OLED screens produced according to present processes and in which the at least two OLED screens are positioned adjacently to one another so as to form an array.

In yet a further aspect of the present invention, the present invention may be generally characterized as an aircraft having the display surface described herein.

These aspects, described in more detail below and in the attached drawings, are believed to provide advantages over the current state of the art, allowing for the effective and efficient production of OLED screens for an aircraft environment. These and other benefits will be appreciated by those of skill in art in view of the present disclosure.

DETAILED DESCRIPTION OF THE DRAWINGS

One or more exemplary embodiments of the present invention will be described below in conjunction with the following drawing figure, in which.

DETAILED DESCRIPTION OF THE INVENTION

As noted above, the present invention provides OLED screens that are more readily adapted to use in an aircraft environment compared with production OLED screens that are designed for consumer goods. The processes of the present invention resize and/or reshape the OLED screens produced for the consumer goods so that the OLED screens have a size and shape that is more suitable for the aircraft environment. Additionally, the processes may be used to change the size and shape of the production OLED screens by cutting through a portion of the display area of the production OLED screens. This provides the ability to make custom sizes and shapes to fit within the aircraft environment.

With these above general aspects of the present invention in mind, one or more embodiments of the present invention will be described with the understanding that the following description is not intended to be limiting.

Figure 1:
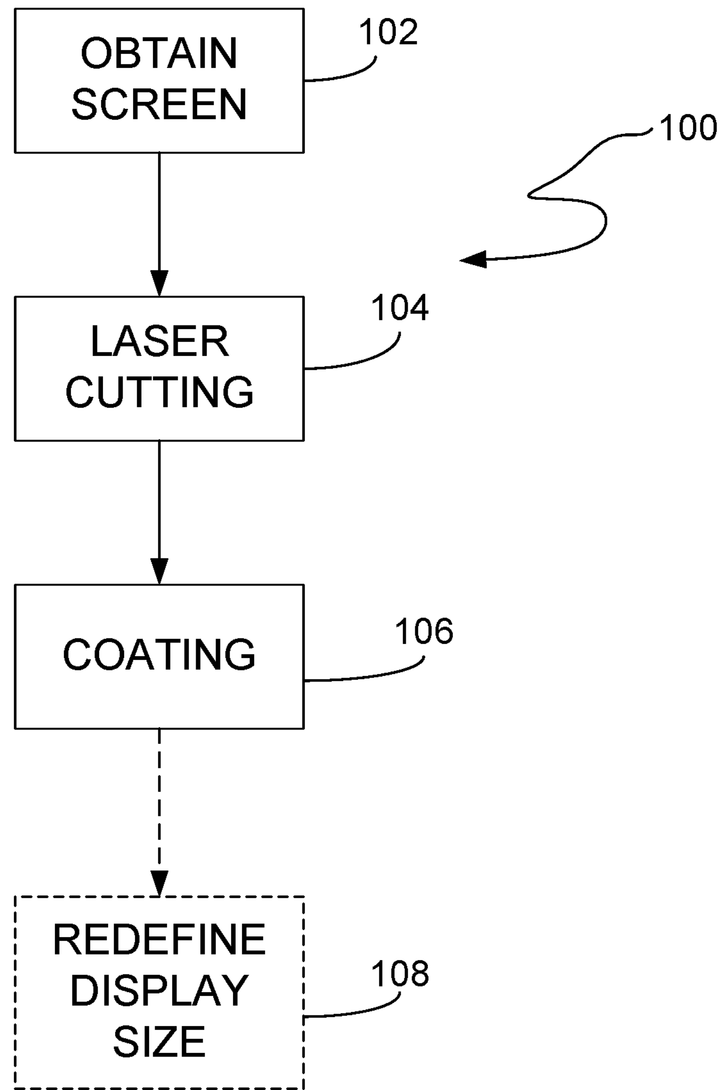
FIG. 1 shows a flow chart for one or more processes according to one or more aspects of the present invention.

An exemplary process 100 according to the present invention is shown in FIG. 1. and will be discussed below. It should be understood and appreciated that while the exemplary process 100 is discussed in terms of OLED screen production for the aircraft environment, it should be appreciated that the resized and/or reshaped OLED screens could be used in any environment.

As shown in FIG. 1, in first step 102, an OLED screen 200 (see, FIG. 2) from a production line (or a production OLED screen) is obtained. By "a production OLED screen," it is meant that the obtained OLED screen 200 has all the materials and layers of material as well as electronics so as to function, when installed in an electronic device. While it may require further production steps to install such a screen in the final electronic device, the production of the screen itself is essentially complete.

Figure 3A:
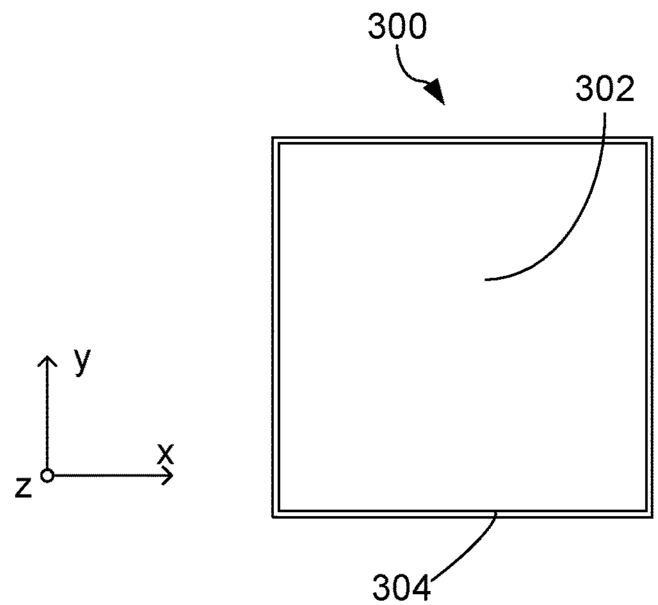
FIG. 3A depicts a front view of an OLED display screen that may be used according to one or more aspects of the present invention.
Figure 3B:
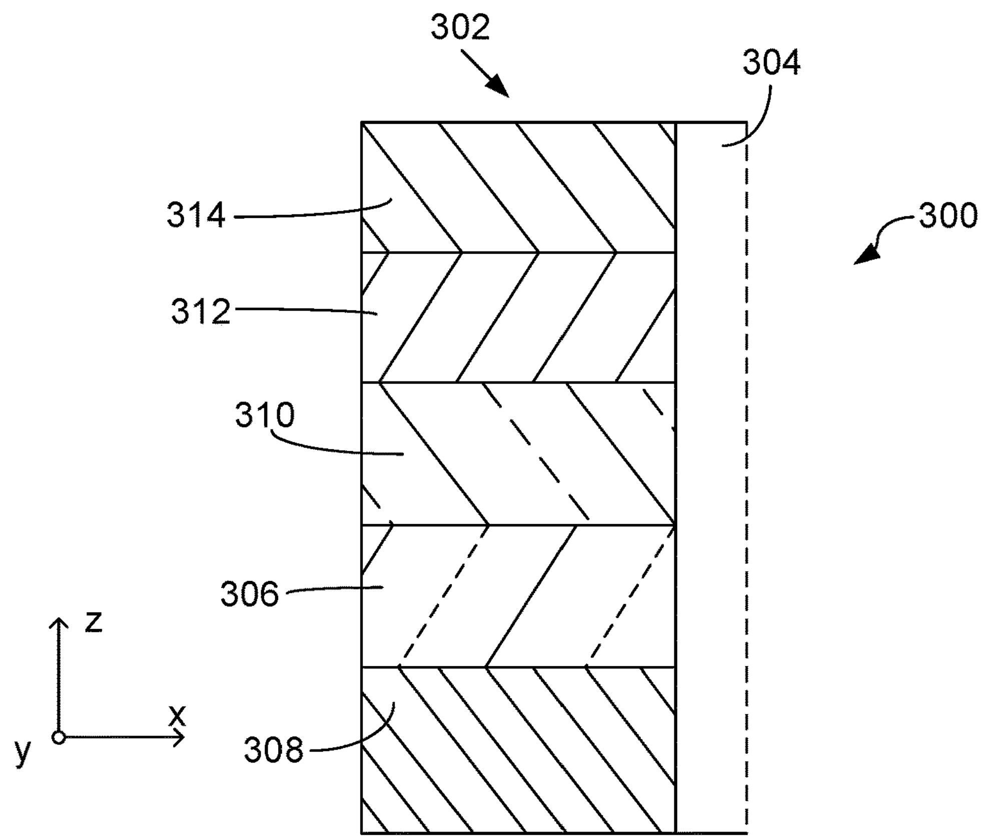
FIG. 3B depicts a side, cutaway view of the OLED display screen shown in FIG. 3A.

As shown in FIGS. 3A and 3B, an OLED screen 300 is depicted in which control circuitry 306 has been moved to behind the display area 302, providing the OLED screen 300 with a bezel area 304 that is reduced or eliminated compared with current OLED display screens.

Specifically, the OLED screen 300 depicted in FIGS. 3A and 3B includes a lower substrate layer 308, the control circuitry 306 disposed on the substrate layer 308, a thin film transistors layer 310 disposed on the control circuitry 306, an OLED layer 312 above the thin film transistors layer 310, and an encapsulation layer 314 on top of the OLED layer 312. The use of "above," "on top" and other similar language is meant in relation to the orientation shown in the drawing. Thus, on one side of the thin film transistors layer 310 is the OLED layer 312, while on the opposite side of the thin film transistors layer 310 is the control circuitry or circuit layer 306. Accordingly, in the OLED screen 300 depicted in FIGS. 3A and 3B, rather than connecting pixel driving circuits to the transistors layer 310 in a horizontal plane (as in conventional OLED screens), the connection between the two is in a vertical plane.

In order to manufacture the OLED display screen 300 depicted in FIGS. 3A and 3B, the circuit layer 306 may be the first layer to be deposited on the substrate 308. Above the circuit layer 306, the thin film transistors layer ("TFT" layer) 310 may be deposited with their already existing fine-masks. The TFT layer 310 will also include spaces on these fine-masks so the conductive molecules can be deposited layer by layer, to form the vertical connections needed. Alternatively, a different manufacturing approach could be to leave holes in every TFT layer and deposit the conductive molecules within the holes once the latest TFT layer has been deposited. Once the TFT layer 310 has been deposited, the OLED layer 312 and encapsulation layers 314 can be applied to form the OLED display screen 300. Accordingly, the OLED display screen 300 depicted in FIGS. 3A and 3B may be used as the production OLED screen 200 in FIG. 2.

Returning to FIG. 2, once the production OLED screen 200 from the production line has been obtained, the process proceeds to cutting 104 where the OLED screen 200 is cut with a laser. For example, an automatic device carrying a microsecond or femtosecond laser will cut through the layers of the production OLED screen with a pulsing laser to obtain a desired size/shape. As an example, the automatic device may be a robot arm controlled by a computer or other processor configured to execute a set of computer instructions. As the robot arm moves, the laser is discharged with a width and pulse that is determined based, in part, on the materials and thickness of the production OLED screen 200.

The use of a laser to cut the screen is important because while cutting 104, a wall effect will be induced around the OLED layer, in response to the heat transfer from the laser beam. The wall effect will be mechanical, chemical, or both. A mechanical wall effect would be the melting of one of the plastic layers of the OLED screen 200, whereas a chemical wall effect would be produced by a chemical reaction of the existing OLED screen 200 molecules and the surrounding oxygen and water moisture, induced as well by the heat transfer from the laser beam. Accordingly, as a result of the wall effect, the organic materials of the production OLED screen 200 will not be exposed to moisture or oxygen. It is also contemplated that other heat transfer cutting methods could be used, such as, for example, plasma cutting.

Figure 2:
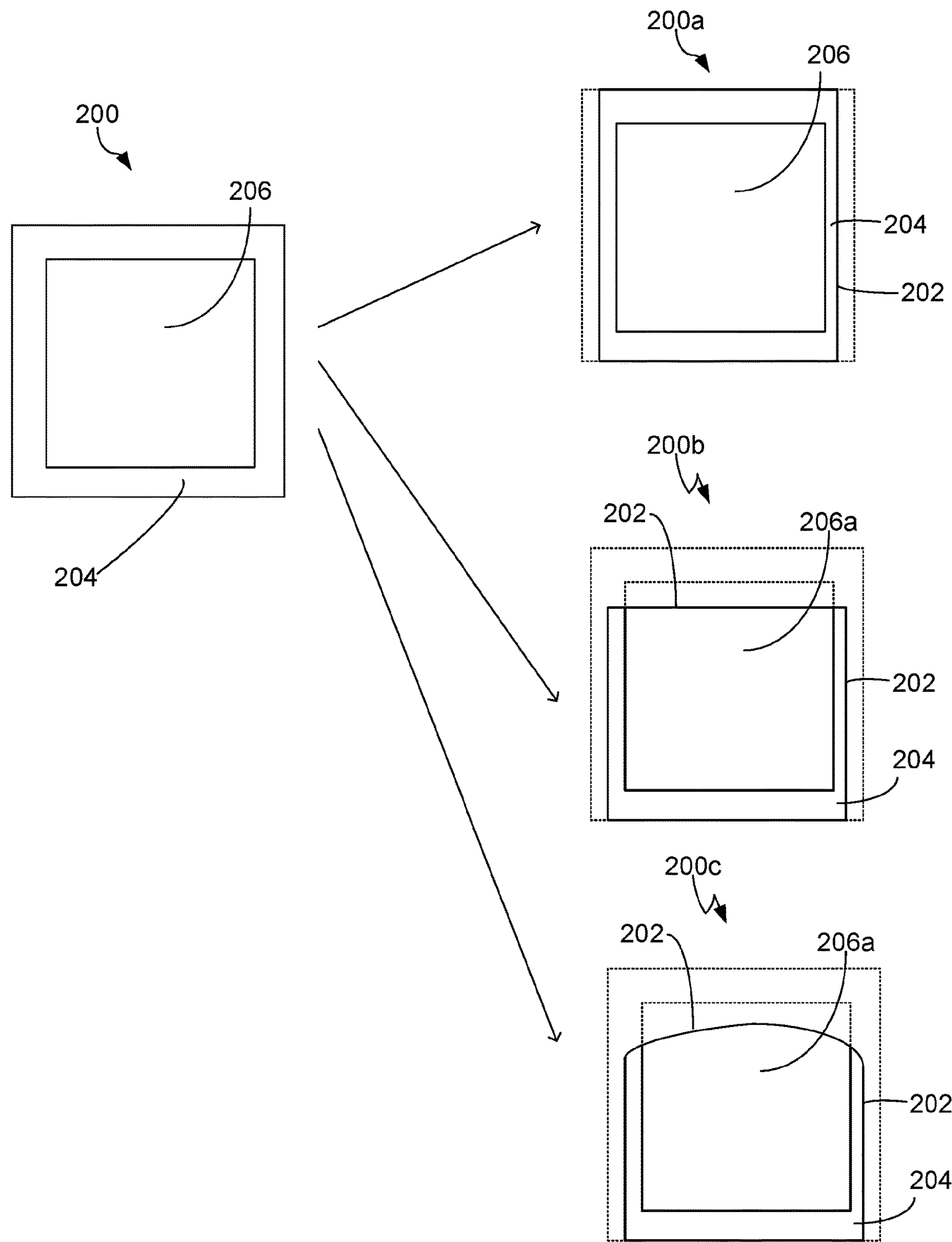
FIG. 2 shows an exemplary production OLED screen and three resized/reshaped OLED screens produced from the production OLED screen according to one or more aspects of the present invention.

As shown in FIG. 2, once the cutting 104 is performed and completed, the production OLED screen 200 will have a cut edge 202. Returning to FIG. 1, the process 100 may then proceed to a coating step 106, preferably a plasma polymer coating, and most preferably an atmospheric plasma polymer coating.

As is known, in atmospheric plasma polymer coating, solid polymers are converted into plasma polymers with an electrical field. The plasma polymers are ejected through a fine nozzle to the cut area, so they can be deposited at the molecular level. The length of these polymers is typically 2 to 3 atoms, so the adherence and the packaging is superior compared to other coatings and processes which utilize or rely on long-chain polymers. Since atmospheric plasma polymer coating is performed at atmospheric pressure, it does not require expensive vacuum environments to be developed. Thus, it is believed to be particularly beneficial in the present processes. The temperature of the plasma projection should not reach a temperature where the display can be damaged. Some conventional atmospheric plasma polymer coating devices have an operation temperature in the range of 50° C.-130° C., which is believed to be suitable for use with the OLED screens 200.

It is contemplated that at least two types of materials can be used for the atmospheric plasma polymer coating: silicon oxides ($SiO_x$) and organic (methane, ethane, e.g.) gases. Silicon oxides have better coating properties but tend to be more rigid, while the organic polymers do not have as high coating properties, but they provide more acceptable flexibility ratios. A combination of these materials may also be utilized.

The coating 106 is performed on the cut edges 202 to seal and prevent future moisture or oxygen penetration. Accordingly, it can also be performed by a device that follows the path of the laser in the cutting 104.

As shown in FIG. 2, such an OLED screen 200*a* is shown on the top right. It is also contemplated in some aspects that the cutting 104 will create cut edges 202 inside of a display area 206 of the production OLED screen 200. As will be appreciated, in some aspects, the bezels 204, the display area 206 or both will be cut in the cutting 104 step.

Accordingly, in the middle right of FIG. 2, an OLED screen 200*b* is shown with a reduced size display screen 206*a* that has an edge 202 that is straight and that was cut through the display area 206 of the production OLED screen 200. In the bottom right of FIG. 2, an OLED screen 200*c* is shown with a reduced size display screen 206*a* that has an edge 202 that is curved, or non-linear, and that was cut through the display area 206 of the production OLED screen 200. Other shapes may be formed.

For screens 200*b*, 200*c*, in which a cut has been made through the display area 206 of the production OLED screen 200, as shown in FIG. 1, the process 100 includes a step of redefining the display size 108. In the step of redefining the display size I 08, it is contemplated that the latest functional pixel per row and column is determined. Using a computer, the pixels that have become in-operative due to the cutting 104 can be determined and used to determine a new display size 206*a* that is smaller in at least one directional measurement (height, width, or both) compared to the display area 206 of the production OLED screen 200. This will result in a new, smaller resolution. Preferably, it is confirmed or verified that the in-operative pixels are outside of the expected resolution. Once the in-operative pixels are determined, and the new resolution defined, any operative pixels that lie outside the display size 206*a* are deactivated.

More specifically, while the cutting 104 should be performed in a way that ensures that the damaged pixels do not extend beyond a certain row and certain column of the display area 206*a*, due to the thermal effect of the laser (or other cutting method), it is contemplated that some pixels inside of the remaining display area 206*a* will be damaged. For example, there may be some rows and/or columns proximate the cut edge that include some pixels that work and some pixels that do not work. Once the maximum row and/or column is determined, any functional pixels outside of these limits should be deactivated.

Figure 4:
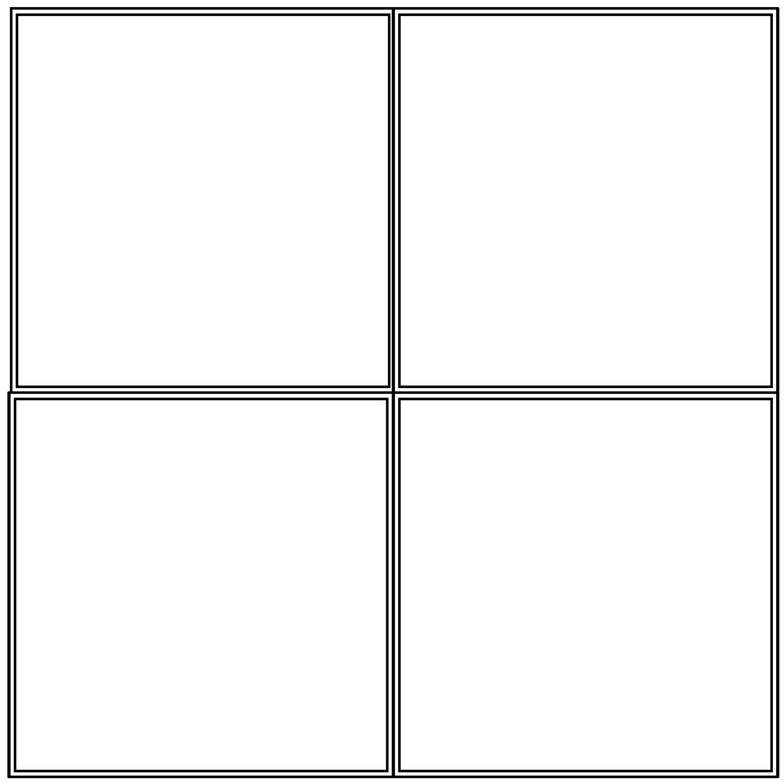
FIG. 4 shows an array with multiple OLED screens produced according to one or more aspects of the present invention; and, FIG. 5 shows an airplane with multiple OLED screens therein.

In some embodiments, the resized/reshaped OLED screens 200*a*, 200*b*, 200*c* produced according to the present processes may be placed adjacent to another resized/reshaped OLED screens 200*a*, 200*b*, 200*c* produced according to the present process or next to a production OLED screen 200 so as to form an array 400, as shown in FIG. 4. In the array 400, the space taken up by the bezels 204 (see FIG. 2) within the combined display area is acceptable for the array 400.

Figure 5:
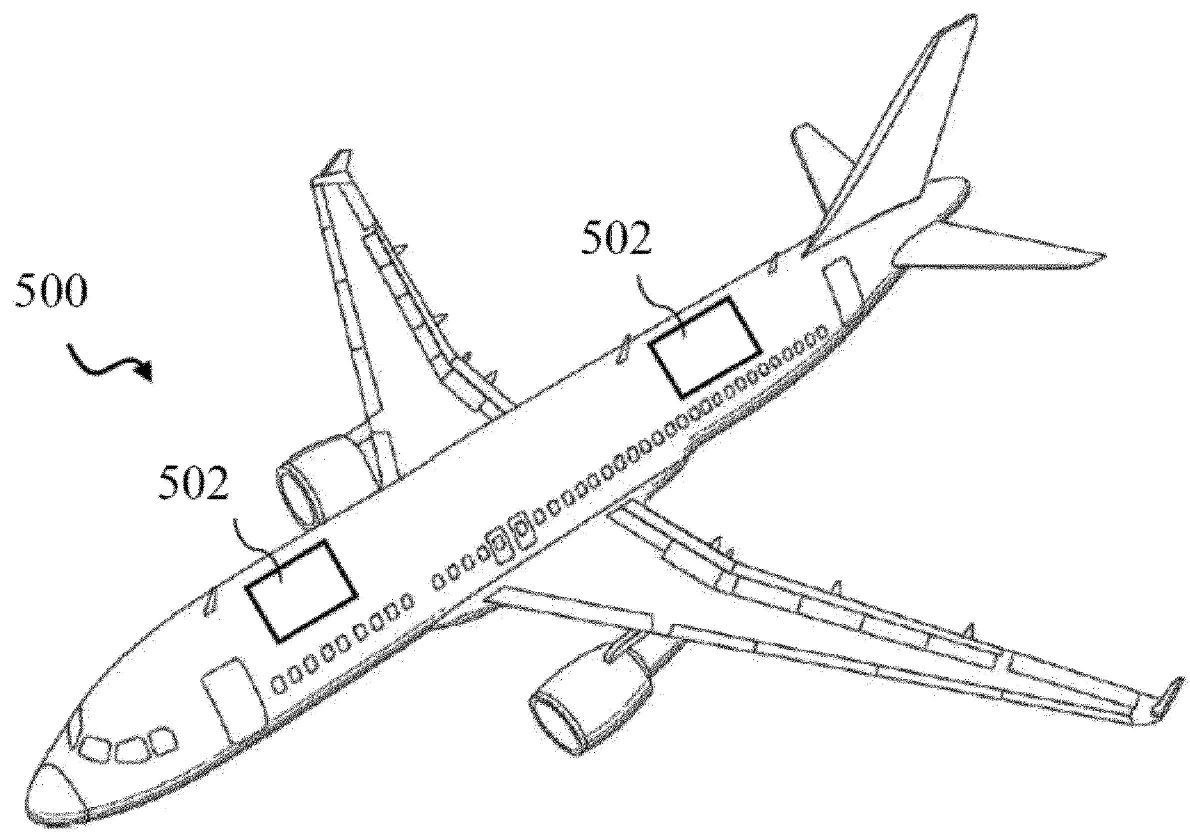

Whether arranged in an array 400, or used alone, the present processes are believed to provide for the ability to effectively and efficiently produce custom sizes and shapes for OLED screens from production OLED screens 200, which, for example, can be used within an aircraft environment. For example, as shown in FIG. 5, an aircraft 500 includes two OLED screens 502. The OLED screens 502 may be individual the OLED screens 200*a*, 200*b*, 200*c* (FIG. 2), or the array 400 (FIG. 4).

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

What is claimed is:

1. A process for producing flexible OLED screens, the process comprising:

obtaining an OLED screen from a production line, the OLED screen including a first display area;

cutting the OLED screen with a laser to reduce a size of the OLED screen and provide a cut OLED screen comprising a cut edge, the cut OLED screen including a second display area;

coating the cut edge by a plasma coating process to provide the cut OLED screen with a reduced size compared to the OLED screen from the production line;

identifying inoperative pixels in the second display area when the cutting of the OLED screen intersects the first display area; and defining a size of the second display area based on an analysis of the first display area and the inoperative pixels in the second display area;

wherein defining the size of the second display area includes:

identifying an expected resolution of the second display area;

selecting a maximum size of the second display area corresponding to a first perimeter of pixels with a number of inoperative pixels satisfying an acceptance threshold; and determining a second perimeter of pixels such that the size of the second display area is within the expected resolution, the second perimeter of pixels corresponding to the size of the second display area and smaller than the first perimeter of pixels.

2. The process of claim 1, wherein the plasma coating process occurs at atmospheric pressure.

3. The process of claim 1, wherein the plasma coating process comprises applying an organic polymer.

4. The process of claim 1, wherein the plasma coating process comprises applying a silicon oxide coating.

5. The process of claim 1, wherein the display area of the OLED screen after the size has been reduced comprises a rectangular shape.

6. The process of claim 1, wherein the display area of the OLED screen after the size has been reduced comprises a shape with a perimeter having a non-linear edge.

7. The process of claim 1, wherein the OLED screen obtained from the production line comprises a display area formed from a plurality layers, the plurality of layers including an OLED layer, a transistor layer, and a circuitry layer, wherein the circuitry layer is disposed on a first side of the transistor layer, and wherein the OLED layer is disposed on a second side of the transistor layer, the second side opposite the first side.

8. The process of claim 1, further comprising:

arranging two OLED screens with cut edges in an array.

9. The process of claim 1, wherein the cut OLED screen is installed in an aircraft.

10. The process of claim 1, wherein at least two of the cut OLED screens are arranged on a display surface, wherein the at least two cut OLED screens are positioned adjacently to one another so as to form an array.

11. The process of claim 10, wherein the display surface is installed in an aircraft.

* * * * *